(12) United States Patent
Ha et al.

(10) Patent No.: US 11,659,776 B2
(45) Date of Patent: May 23, 2023

(54) HIGH TEMPERATURE-SUPERCONDUCTING WIRE HAVING SUPERCONDUCTING LAYER STAKED THEREON AND METHOD FOR MANUFACTURING SAME

(71) Applicant: Korea Electrotechnology Research Institute, Changwon-si (KR)

(72) Inventors: Hong Soo Ha, Changwon-si (KR); Sang Soo Oh, Gimhae-si (KR); Sung Kyu Kim, Gyeongsangnam-do (KR)

(73) Assignee: Korea Electrotechnology Research Institute

( * ) Notice: Subject to any disclaimer, the term of this patent is extended or adjusted under 35 U.S.C. 154(b) by 42 days.

(21) Appl. No.: 16/890,011

(22) Filed: Jun. 2, 2020

(65) Prior Publication Data
US 2020/0313064 A1 Oct. 1, 2020

Related U.S. Application Data

(63) Continuation of application No. PCT/KR2019/003127, filed on Mar. 19, 2019.

(30) Foreign Application Priority Data

Apr. 10, 2018 (KR) .......................... 10-2018-0041360

(51) Int. Cl.
*H01B 12/06* (2006.01)
*H01F 6/06* (2006.01)

(52) U.S. Cl.
CPC ......... *H10N 60/0632* (2023.02); *H01B 12/06* (2013.01); *H01F 6/06* (2013.01)

(58) Field of Classification Search
CPC ........ H10N 60/0632; H01B 12/06; H01F 6/06
See application file for complete search history.

(56) References Cited

U.S. PATENT DOCUMENTS

| 7,071,148 B1* | 7/2006 | Selvamanickam ..... H01L 39/02 505/234 |
| 9,082,530 B2* | 7/2015 | Hanafusa ............ H01L 39/2422 |

(Continued)

FOREIGN PATENT DOCUMENTS

| JP | 2004253473 A | 9/2004 |
| JP | 2007-266149 A | 10/2007 |

(Continued)

OTHER PUBLICATIONS

Machine translation of JP 2004-253473 (Year: 2004).*

(Continued)

*Primary Examiner* — Paul A Wartalowicz
(74) *Attorney, Agent, or Firm* — Park & Associates IP Law Office

(57) ABSTRACT

The present invention relates to a high temperature-superconducting wire having a superconducting layer laminated thereon and a method of manufacturing the same. The method includes: preparing a pair of superconducting wires each of which includes a metal substrate, a buffer layer, a superconducting layer, and a protective layer; laminating the pair of superconducting wires to allow respective protective layers to face each other; performing thermal treatment to the laminated superconducting wires to join the protective layers together; separating the metal substrate and the buffer layer from the superconducting layer on one side; and forming a protective layer on an upper part of the superconducting layer having a surface exposed. The present invention provides a high temperature-superconducting wire which includes a plurality of biaxially textured superconducting layers laminated thereby improving electro-conductivity, wherein the plurality of superconducting layers are separated from each other thereby reducing a loss of alternating current.

9 Claims, 7 Drawing Sheets

(56) References Cited

U.S. PATENT DOCUMENTS

| | | | | |
|---|---|---|---|---|
| 2002/0144838 | A1* | 10/2002 | Fritzemeier | H01L 39/143 174/125.1 |
| 2004/0069526 | A1* | 4/2004 | Darmann | H01L 39/143 174/125.1 |
| 2006/0033160 | A1* | 2/2006 | Findikoglu | H01L 31/036 257/347 |
| 2007/0179063 | A1* | 8/2007 | Malozemoff | H01L 39/24 505/329 |
| 2010/0167084 | A1* | 7/2010 | Bhattacharya | C25D 5/611 205/333 |
| 2019/0131512 | A1* | 5/2019 | Solovyov | H01L 39/143 |

FOREIGN PATENT DOCUMENTS

| | | |
|---|---|---|
| JP | 2017-117523 A | 6/2017 |
| KR | 10-2016-0019684 A | 2/2016 |
| KR | 10-2017-0052188 A | 5/2017 |
| WO | 2017057985 A1 | 4/2017 |

OTHER PUBLICATIONS

Machine translation of KR 10-2016-0019684 (Year: 2016).*
Machine translation of JP 2007-266149 (Year: 2007).*
International Search Report(PCT/KR2019/003127), WIPO, dated Jun. 19, 2019.

* cited by examiner

HIGH TEMPERATURE-SUPERCONDUCTING WIRE HAVING SUPERCONDUCTING LAYER STAKED THEREON AND METHOD FOR MANUFACTURING SAME

REFERENCE TO RELATED APPLICATIONS

This is a continuation of International Patent Application PCT/KR2019/003127 filed on Mar. 19, 2019, which designates the United States and claims priority of Korean Patent Application No. KR 10-2018-0041360 filed on Apr. 10, 2018, the entire contents of which are incorporated herein by reference.

FIELD OF THE INVENTION

The present invention relates generally to a high temperature-superconducting wire having a superconducting layer laminated thereon and a method of manufacturing the same. More particularly, the present invention relates to a high temperature-superconducting wire having a superconducting layer laminated thereon, wherein the high temperature-superconducting wire includes a plurality of biaxially textured superconducting layers laminated thereby improving electro-conductivity, and the plurality of superconducting layers are separated from each other thereby reducing a loss of alternating current, and relates to a method of manufacturing the same.

BACKGROUND OF THE INVENTION

Superconducting wires are wires made of a material with zero electrical resistance. Materials of which current resistance is near zero, near temperature of 4 K at which helium is liquid, are referred to as low-temperature superconductors (LTS), and materials which exhibit superconductivity at 77 K, which is a temperature at which nitrogen is liquid, are referred to as high temperature superconductors (HTS). Of these, a high temperature-superconducting wire is manufactured by coating a plurality of buffer layers on an upper part of a tape-shaped metal layer, and coating a superconducting layer on an upper part of the buffer layer by a physical or chemical method. In the high temperature-superconducting wire in which the metal layer, the buffer layer, and the superconducting layer are sequentially laminated, the superconducting layer exposed externally is additionally coated with silver (Ag) as necessary. The high temperature-superconducting wire exhibits a high critical temperature, critical current density, and critical magnetic field and thus is expected to be applied to superconducting application devices for power generation such as superconducting magnets, superconducting cables, superconducting motors, or superconducting generators.

In order to manufacture an application device including a high temperature-superconducting wire which can be used at liquid nitrogen temperature, high electro-conductivity and excellent electro-conductivity in a magnetic field are required. However, the high temperature-superconducting wire is limited in applications due to its low electro-conductivity, and thus, under a liquid nitrogen temperature condition, is used where a very low magnetic field is generated, such as cables. In an effort to overcome this problem, research such as introducing flux pinning center to improve the critical current property in magnetic fields have been actively conducted, but the performance sufficient to be applied at liquid nitrogen temperature has not yet been secured.

Superconducting application devices are mainly used in a form of coils other than current-carrying devices such as cables and busbars. In the case of such a coil, a magnetic field is generated when current flows through the coil. Most of the general application devices are used in a magnetic field generation region of about 3 to 5 Tesla. Therefore, if a high temperature-superconducting wire that can be applied to a coil generating a magnetic field of about 3 to 5 Tesla at liquid nitrogen temperature can be manufactured, commercialization of superconducting application devices can be significantly accelerated.

SUMMARY OF THE INVENTION

Accordingly, an objective of the present invention is to provide a high temperature-superconducting wire having a superconducting layer laminated thereon, wherein the high temperature-superconducting wire includes a plurality of biaxially textured superconducting layers laminated thereby improving electro-conductivity, and the plurality of superconducting layers are separated from each other thereby reducing a loss of alternating current, and relates to a method of manufacturing the same.

The above objective is accomplished by a method of manufacturing a high temperature-superconducting wire having a superconducting layer laminated thereon, the method including: preparing a pair of superconducting wires each of which includes a metal substrate, a buffer layer, a superconducting layer, and a protective layer; laminating the pair of superconducting wires to allow respective protective layers to face each other; performing thermal treatment to the laminated superconducting wires to join the protective layers together; separating the metal substrate and the buffer layer from the superconducting layer on one side; and forming a protective layer on an upper part of the superconducting layer having a surface exposed.

Here, the laminating the pair of superconducting wires may be performed by arranging the pair of superconducting wires so that the protective layers face each other and then winding the superconducting wires on a winding bobbin while applying tension thereto, wherein the superconducting wires may be continuously pressurized by winding.

Furthermore, the joining the protective layers together may be performed by joining the protective layers together by diffusion through the thermal treatment to form a single protective layer in which no interface exists, and the superconducting wires may be composed of the metal substrate, the buffer layer, the superconducting layer, the protective layer, the superconducting layer, and the metal substrate.

The separating the metal substrate may be performed by separating the buffer layer and the metal substrate, which form a relatively weaker bond than that of the superconducting layer and the protective layer, from the superconducting layer by means of physical force, and the superconducting wires may be composed of the metal substrate, the buffer layer, the superconducting layer, the protective layer, and the superconducting layer.

In the separating the metal substrate, the metal substrate and the buffer layer separated from the superconducting layer may be reused.

After the forming the protective layer on the upper part of the superconducting layer, laminating another superconducting wire, joining protective layers together, separating a metal substrate, and forming a protective layer may be repeatedly performed to laminate a plurality of superconducting layers and protective layers thereby forming a laminated superconducting wire in which the plurality of superconducting layers are repeatedly laminated.

At least one of the plurality of superconducting layers constituting the laminated superconducting wire may be configured as a superconducting layer having a different magnetic field property than other superconducting layers, and the laminated superconducting wire may be cut along a laminating direction into at least one or more pieces of wires to form a plurality of cut superconducting wires.

The superconducting wires may have a biaxially textured structure, and the superconducting wires may be made of a material including a flux pinning center, or a rare earth element-barium-copper-oxygen (RE-Ba—Cu—O) based material including rare earth; and the protective layer may be made of a noble metal, and the noble metal may be selected from the group consisting of silver (Ag), gold (Au), platinum (Pt), palladium (Pd), ruthenium (Ru), rhodium (Rh), iridium (Ir), osmium (Os), rhenium (Re), and a mixture thereof.

The above objective is also accomplished by a high temperature-superconducting wire having a superconducting layer laminated thereon, the high temperature-superconducting wire including: a metal substrate; a plurality of superconducting layers laminated on the metal substrate; and a plurality of protective layers laminated between the plurality of superconducting layers to separate the superconducting layers from each other, wherein the superconducting layers are biaxially textured.

According to the configuration of the present invention described above, it is possible to obtain a high temperature-superconducting wire in which a plurality of biaxially textured superconducting layers are laminated thereby improving electro-conductivity, and the plurality of superconducting layers are separated from each other thereby reducing a loss of alternating current.

DETAILED DESCRIPTION OF THE INVENTION

Hereinafter, a high temperature-superconducting wire having a superconducting layer laminated thereon according to an embodiment of the present invention and a method of manufacturing the same will be described in detail with reference to the drawings.

A conventional superconducting wire uses a thin film coating method, and thus a single superconducting layer is formed. And, a technique in which superconducting wires are laminated in multiple layers and the laminated superconducting wires are made into a laminated superconducting unit by soldering to produce a conductor capable of conducting high current is mainly used. However, the laminated superconducting wire unit according to the related art has a disadvantage in that the current value does not significantly increase compared to the laminating thickness because a plurality of layers other than the superconducting layer are laminated.

A high temperature-superconducting wire having a superconducting layer laminated thereon according to the present invention includes a metal substrate, a plurality of superconducting layers laminated on an upper part of the metal substrate, and a plurality of protective layers laminated between the plurality of superconducting layers to separate the superconducting layers from each other, and it is preferable that the superconducting layers are biaxially textured. Here, it is preferable to include a buffer layer between the metal substrate and the superconducting layers laminated on the upper part of the metal substrate.

Figure 1:
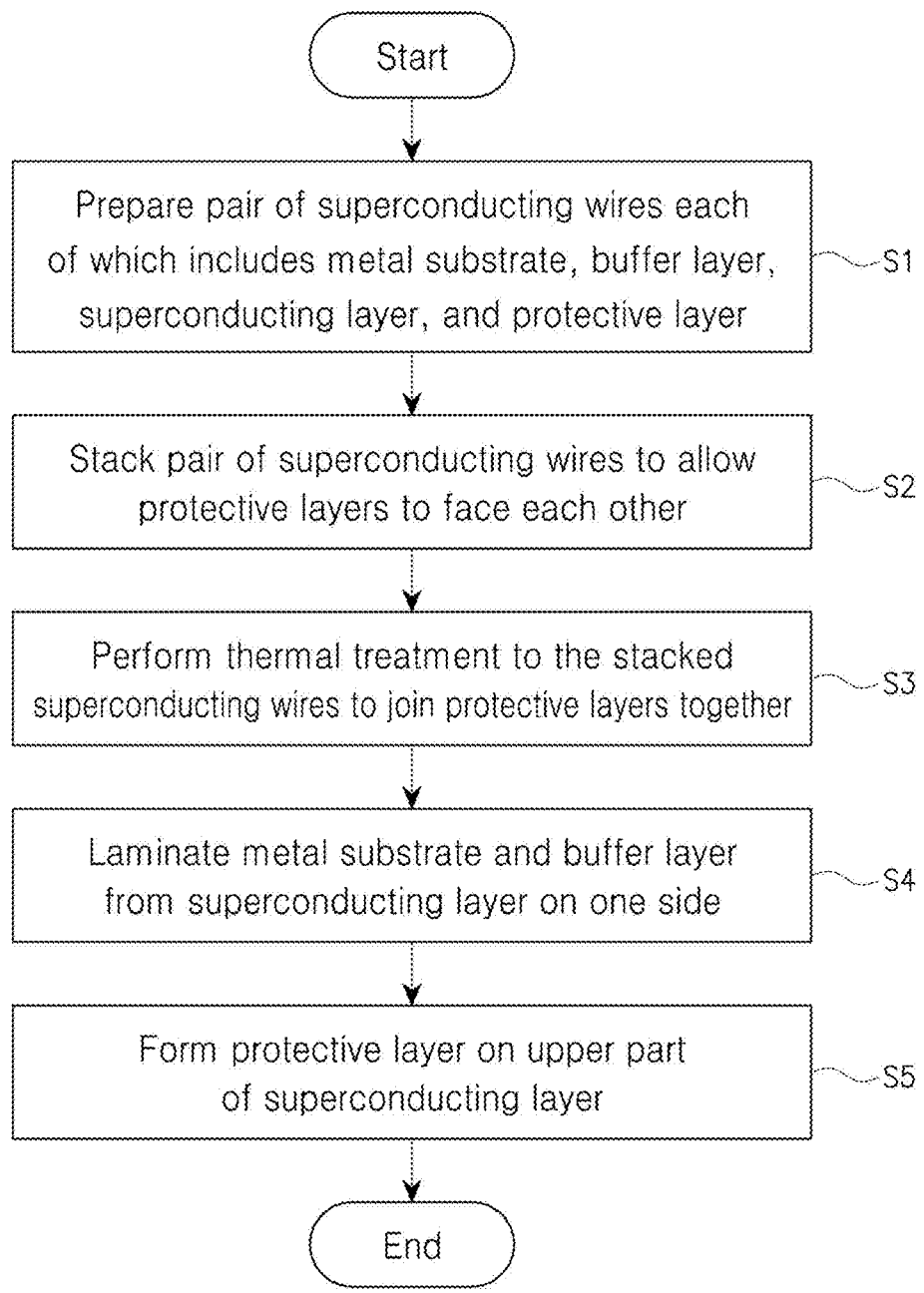
FIGS. 1 to 3 are flow charts illustrating a method of manufacturing a laminated high temperature-superconducting wire according to an embodiment of the present invention.
Figure 2:
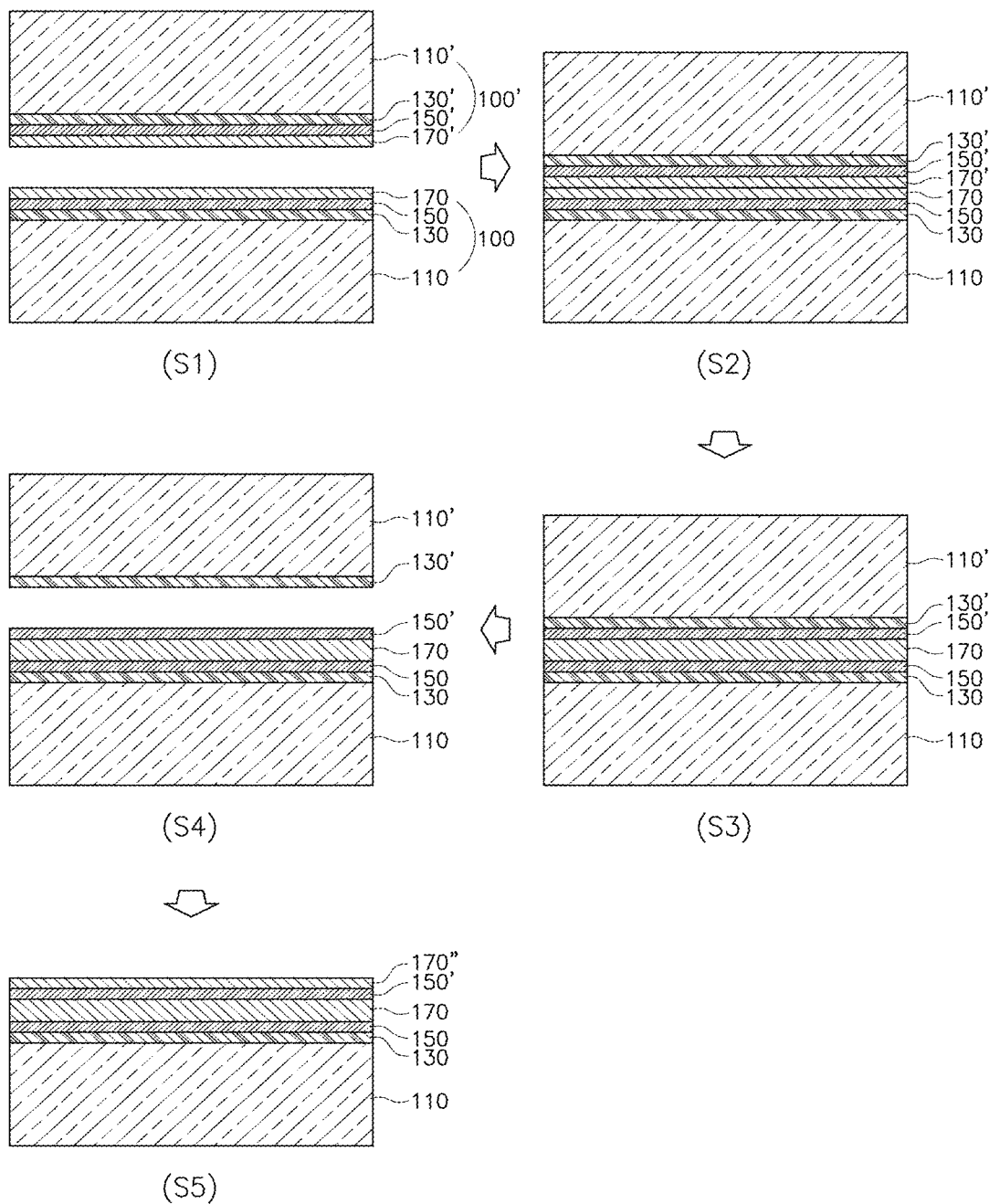
Figure 3:
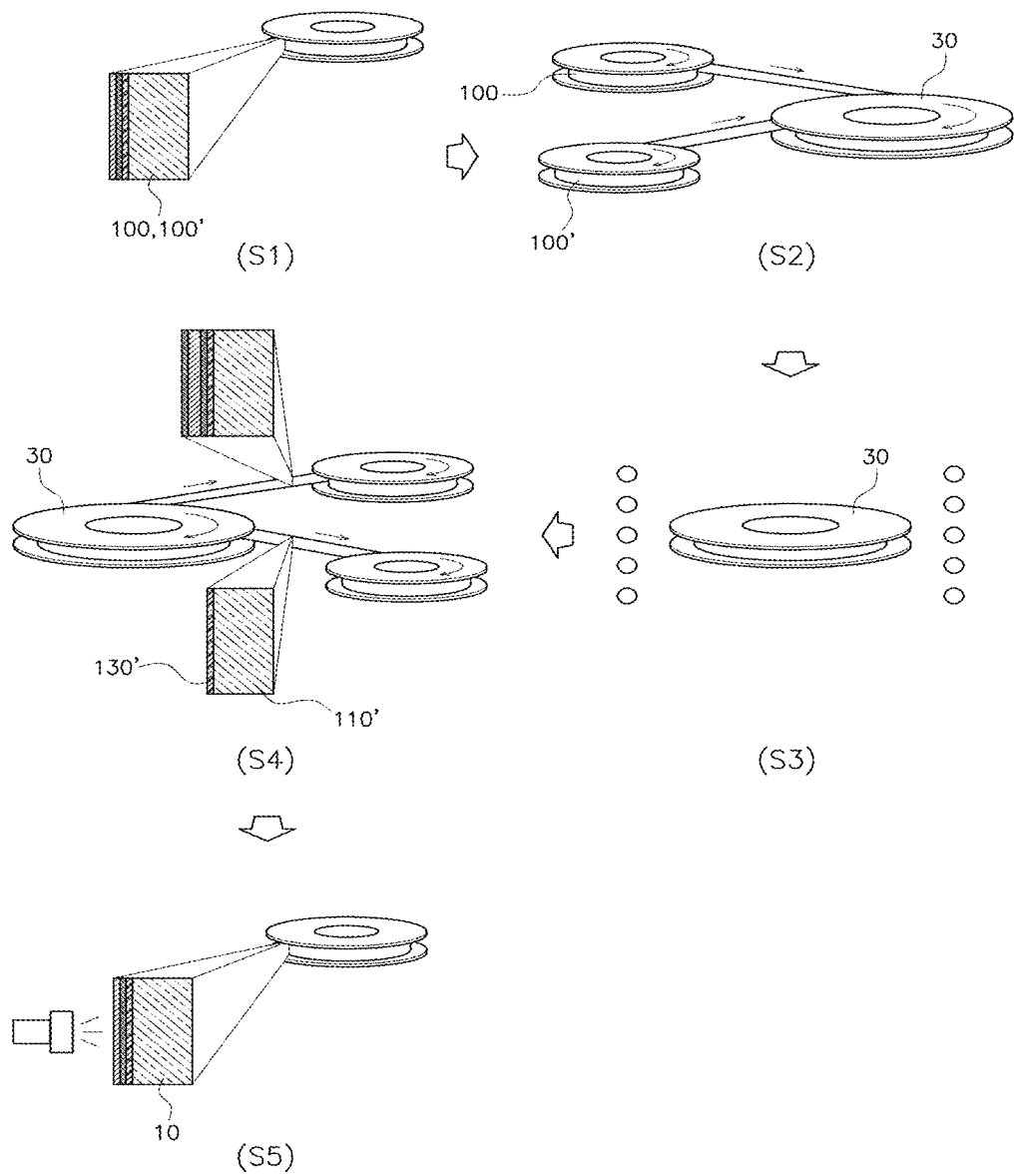

In a method of manufacturing the superconducting wire having the superconducting layer laminated thereon, first, as illustrated in FIGS. 1 to 3, a pair of superconducting wires each of which includes a metal substrate, a buffer layer, a superconducting layer, and a protective layer is prepared (S1).

At this time, a pair of superconducting wires having superconducting layers having the same magnetic field properties may be prepared, or a pair of superconducting wires having superconducting layers having different magnetic field properties may be prepared.

A pair of superconducting wires 100 and 100' composed of metal substrates 110 and 110', superconducting layers 150 and 150', and protective layers 170 and 170' is prepared, wherein buffer layers 130 and 130' may be further provided between the metal substrates 110 and 110' and the superconducting layers 150 and 150' to form superconducting wires 100 and 100' composed of the metal substrates 110 and 110', the buffer layers 130 and 130', the superconducting layers 150 and 150', and the protective layers 170 and 170'. However, in some cases, the provision of the buffer layers 130 and 130' may be eliminated, or instead of the buffer layers 130 and 130', the protective layers 170 and 170' may be formed between the metal substrates 110 and 110' and the superconducting layers 150 and 150'. This can be appropriately applied depending on the application field of the laminated superconducting wire 10.

Here, the metal substrates 110 and 110' may be made of Hastelloy or stainless steel having oxidation resistance, but is not limited thereto. The buffer layers 130 and 130' formed on upper parts of the metal substrates 110 and 110' are formed between the metal substrates 110 and 110' and the superconducting layers 150 and 150' and serve to buffer various external stimuli. In detail, when manufacturing the superconducting wires 100 and 100', the superconducting layers 150 and 150' are formed under a high temperature condition. At this time, a metal material of the metal substrates 110 and 110' is diffused into the superconducting layers 150 and 150' and thereby serves to prevent contamination of the superconducting layers 150 and 150', and improve the superconducting properties of the superconducting layers 150 and 150'. The buffer layers 130 and 130' employ the use of biaxially textured buffer layers 130 and 130', and when the biaxially textured buffer layers 130 and 130' are used, the superconducting layers 150 and 150' formed thereon may have biaxially textured crystallites. The biaxially textured buffer layers 130 and 130' may be formed through a thin film manufacturing process such as IBAD, RABiTs, or ISD.

The superconducting layers 150 and 150' formed on the buffer layers 130 and 130' are formed by vapor deposition, and the superconducting layers 150 and 150' also have a biaxially textured structure by the biaxially textured buffer layers 130 and 130'. The biaxially textured structure refers to a structure in which the c-axis is oriented along the thickness direction and the a-b plane is oriented along the longitudinal direction. In the degree of biaxial texture, the degree of in-plane orientation ($\Delta\Phi$) is $2°<\Delta\Phi<10°$, and the degree of out-of-plane orientation ($\Delta\omega$) is $1°<\Delta\omega<7°$. When the biaxially textured superconducting layers 150 and 150' are formed as above, it is possible to obtain superconducting wires 100 and 100' having excellent electro-conductivity.

In some cases, the protective layers 170 and 170' made of a noble metal may be formed between the metal substrates 110 and 110' and the superconducting layers 150 and 150' without separately forming the buffer layers 130 and 130'. This can be appropriately applied depending on the shape or use of the laminated superconducting wire 10 that is finally manufactured.

The superconducting layers 150 and 150' are made of a material including a flux pinning center or a material in which rare earth is mixed to form the superconducting layers 150 and 150'. As the material of the superconducting layers 150 and 150' made of rare earth elements, a rare earth element-barium-copper-oxygen (RE-Ba—Cu—O) based material may be used. For example, gadolinium-barium-copper-oxygen (GdBCO), samarium-barium-copper-oxygen (SmBCO), europium-barium-copper-oxygen (EuBCO), yttrium-barium-copper-oxygen (YBCO), holmium-barium-Copper-oxygen (HoBCO), and a mixture thereof may be used. In some cases, the superconducting layers 150 and 150' may be formed in a structure in which a plurality of Re2O3 oxides exists, and may also be formed in a structure in which a plurality of copper oxides exists outside the superconducting layers 150 and 150'.

In the superconducting wires 100 and 100' in which the metal substrates 110 and 110', the buffer layers 130 and 130', and the superconducting layers 150 and 150' are sequentially laminated, the protective layers 170 and 170' are laminated on upper parts of the superconducting layers 150 and 150'. The protective layers 170 and 170' are thinly coated on the upper parts of the superconducting layers 150 and 150', and serve to protect the superconducting layers 150 and 150' from external conditions. It is preferable that the protective layers 170 and 170' are made of a noble metal. The noble metal does not react in contact with the superconducting layers 150 and 150' and serves to prevent separation and deterioration of the superconducting layers 150 and 150'. Additionally, the protective layers 170 and 170' may be exposed to air in a subsequent process, and thus it is preferable that the protective layers are made of a noble metal that does not oxidize even in contact with air.

Here, it is preferable that the noble metal is selected from the group consisting of silver (Ag), gold (Au), platinum (Pt), palladium (Pd), ruthenium (Ru), rhodium (Rh), iridium (Ir), osmium (Os), rhenium (Re), and a mixture thereof, but is not limited thereto. The thickness of the protective layers 170 and 170' is preferably 0.5 to 10 This is because if the thickness is less than 0.5 the superconducting layers 150 and 150' cannot be properly protected, and when the thickness is greater than 10 the protective layers 170 and 170' are too thick, thereby increasing the overall thickness of the superconducting wires 100 and 100', which makes it impossible to obtain a laminated superconducting wire 10 having a high current compared to thickness ratio. Additionally, the protective layers 170 and 170' may be biaxially textured or not be biaxially textured, like in the case of the superconducting layers 150 and 150'.

The pair of superconducting wires are laminated to allow the protective layers to face each other (S2).

The pair of superconducting wires 100 and 100' composed of the metal substrates 110 and 110', the buffer layers 130 and 130', the superconducting layers 150 and 150', and the protective layers 170 and 170' are laminated so that the protective layers 170 and 170' face each other. At this time, since the protective layers 170 and 170' are made of a noble metal, the protective layers are in a metal state in which no oxidation occurs on the surfaces thereof, and it is preferable that the protective layers 170 and 170' are made of the same material. The superconducting wires 100 and 100' may be laminated along the longitudinal direction. However, due to the fact that the superconducting wires 100 and 100' are generally made in a very long length during production, it may not easy to perform plane pressing if the superconducting wires are laminated only in the longitudinal direction. Therefore, the pair of superconducting wires 100 and 100' may be laminated in such a manner that the pair of superconducting wires 100 and 100' are supplied from bobbins on which the respective superconducting wires are wound and are arranged so that the protective layers face each other, and then the superconducting wires are wound on a winding bobbin 30 while tension is applied thereto. When winding of the superconducting wires 100 and 100' is performed while applying tension thereto, the superconducting wires 100 and 100' can be laminated in close contact with each other by pressure. As described above, the superconducting wires 100 and 100' made in a long length can be easily laminated and pressurized by a continuous pressing method using the winding bobbin 30. At this time, co-winding of a dummy wire may be possible.

The laminated superconducting wires are subjected to thermal treatment to join the protective layers together (S3).

The laminated superconducting wires 100 in which the protective layers 170 and 170' made of the same material face each other are subjected to thermal treatment to join the protective layers 170 and 170' together so that no interface exists between the protective layers 170 and 170'. Since the protective layers 170 and 170' are made of a noble metal, the surfaces thereof do not oxidize even upon exposure to air. When the non-oxidized protective layers 170 and 170' are laminated and subjected to thermal treatment, the protective layers 170 and 170' are joined together by diffusion to form a single protective layer 170 and 170' having no interface. When the protective layers 170 and 170' are joined together as described above, the laminated superconducting wires 100 and 100' are formed into a single superconducting wire composed of the metal substrate 110, the buffer layer 130, the superconducting layer 150, the protective layer 170, the superconducting layer 150', the buffer layer 130', and the metal substrate 110'.

The thermal treatment temperature is preferably made at 400 to 600° C. This is because when the thermal treatment temperature is less than 400° C., joining between the protective layers 170 and 170' by diffusion does not completely occur, which makes it difficult to join the protective layers 170 and 170', and when the thermal treatment temperature is greater than 600° C., the superconducting layers 150 and 150' may lose superconducting properties. Therefore, it is preferable that the thermal treatment is performed at 400 to 600° C., which is a temperature at which the protective layers 170 and 170' can be joined together while maintaining the shape thereof.

And, the superconducting layers 150 and 150' may be superconducting layers 150 and 150' having the same magnetic field properties, or may be superconducting layers 150 and 150' having different magnetic field properties. That is, it is preferable that the superconducting layers are formed by using a combination of different types or of superconducting layers having different magnetic field properties, so that the superconducting layers have high electro-conductivity in both weak and strong magnetic fields depending on the properties of each of the superconducting layers.

The metal substrate is separated from the superconducting layer on one side (S4).

In the superconducting wire 100 composed of the metal substrate 110, the buffer layer 130, the superconducting layer 150, the protective layer 170, the superconducting layer 150', the buffer layer 130', and the metal substrate 110', the metal substrate 110' and the buffer layer 130' on one side are separated from the superconducting layer 150'. At this time, as a method of separating the metal substrate 110' from the superconducting layer 150', a method of exfoliating the metal substrate 110' by means of physical force is used. When the metal substrate 110' is exfoliated by physical force, the protective layer 170 and the superconducting layer 150' forming a relatively strong bond therebetween exist in a firmly coupled state, while in the case of the superconducting layer 150' and the buffer layer 130' or the metal substrate 110' forming a relatively weak bond therebetween, the buffer layer 130' or the metal substrate 110 is separated from the superconducting layer 150'. When the metal substrate 110' is separated as described above, the metal substrate 110, the buffer layer 130, the superconducting layer 150, the protective layer 170, and the superconducting layer 150' remain as the superconducting wire 100, and the superconducting layer 150' which is laminated on the outermost side is exposed.

When the superconducting wire 100 exists in a wound state on the winding bobbin 30, the metal substrate 110' may be separated while winding the superconducting wire 100 and the metal substrate 110' on different bobbins so that tension is applied to the superconducting wire 100, in this case, separation of the metal substrate can be more facilitated.

The metal substrate 110' and the buffer layer 130' or the metal substrate 110' separated from the superconducting layer 150' may be reused.

In more detail, a superconducting layer may be re-deposited on an upper part of the buffer layer 130' by reusing the separated metal substrate 110' and the buffer layer 130'. In some cases, a protective layer may be formed on an upper part of the deposited superconducting layer to obtain a superconducting wire.

A protective layer is formed on the superconducting layer (S5).

In the superconducting wire 100 existing as the metal substrate 110, the buffer layer 130, the superconducting layer 150, the protective layer 170, and the superconducting layer 150' exists with the surface exposed, and a protective layer 170" is formed on the upper part of the superconducting layer 150'. Here, as in the step S1, it is preferable that the protective layer 170" is made of a noble metal that does not easily oxidize. When the protective layer 170" is laminated as described above, it is possible to obtain a laminated superconducting wire 10 in which a plurality of superconducting layers 150 and 150' and protective layers 170 and 170" are laminated.

Through the steps S1 to S5, it is possible to obtain a laminated superconducting wire 10 composed of two layers of the superconducting layers 150 and 150'. However, when the laminated superconducting wire 10 is applied to a field requiring a higher current density, the steps S2 to S5 may be repeatedly performed to laminate a superconducting layer and a protective layer in a desired number to form a plurality of layers.

In more detail, after the step of forming the protective layer on the upper part of the superconducting layer (S5), the steps of laminating another superconducting wire (S2), joining protective layers together (S3), separating a metal substrate (S4), and forming a protective layer (S5) may be repeatedly performed to laminate a plurality of superconducting layers and protective layers thereby forming a laminated superconducting wire 10 in which the plurality of superconducting layers are repeatedly laminated.

Here, at least one of the plurality of superconducting layers constituting the laminated superconducting wire 10 may be configured as a superconducting layer having a different magnetic field property than other superconducting layers. That is, the superconducting layers may be formed by using a combination of different types or of superconducting layers having different magnetic field properties, so that the superconducting layers may have high electro-conductivity in both weak and strong magnetic fields depending on the properties of each of the superconducting layers.

Figure 4A:
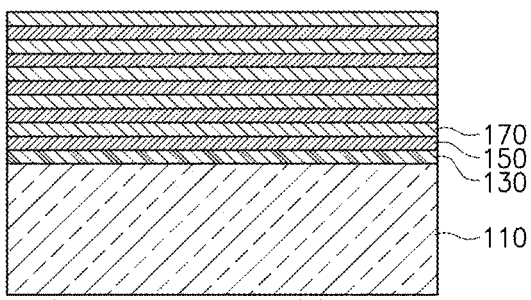
FIGS. 4A to 4E are sectional views illustrating the laminated high temperature-superconducting wire according to the embodiment of the present invention.
Figure 4B:
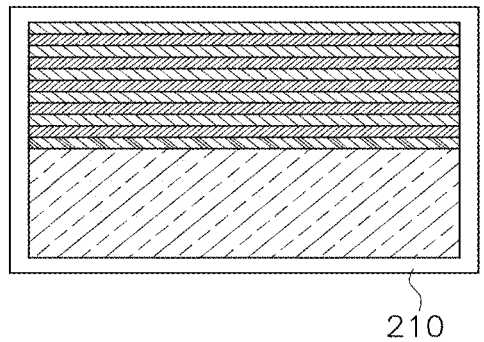
Figure 4C:
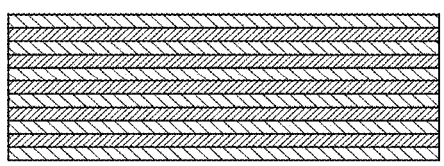
Figure 4D:
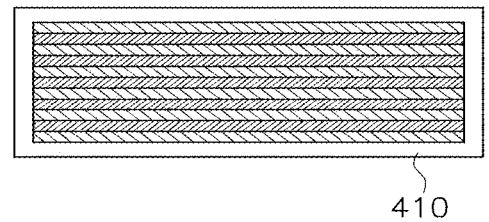
Figure 4E:
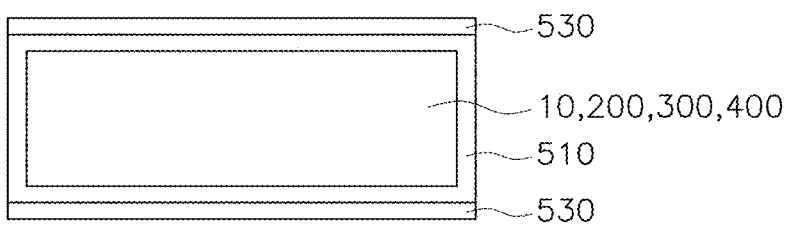

FIG. 4A is a sectional view illustrating the laminated superconducting wire 10 in which the plurality of superconducting layers 150 and protective layers 170 are laminated by repeatedly performing the steps S2 to S5. When the plurality of superconducting layers 150 are laminated as described above, current properties may increase. FIG. 4B illustrates a laminated superconducting wire 200 obtained by manufacturing the superconducting wire as illustrated in FIG. 4A and forming a metal coating 210 thereon to protect the superconducting wire. Here, the metal can appropriately use copper, bronze, brass, stainless steel, or the like. FIG. 4C illustrates a laminated superconducting wire 300 obtained by manufacturing the superconducting wire as illustrated in FIG. 4A and removing a metal substrate therefrom, and this shape can be appropriately used depending on application fields. FIG. 4d illustrates a laminated superconducting wire 400 obtained by forming a metal coating 410 on the surface of the superconducting wire illustrated in FIG. 4C. FIG. 4E illustrates that a soldering 510 and additional metal substrates 530 are formed on outer surfaces of the respective superconducting wires 10, 200, 300, and 400 respectively illustrated FIGS. 4A, 4B, 4C, and 4D. This structure can increase the mechanical strength of a laminated superconducting wire 500.

Figure 5:
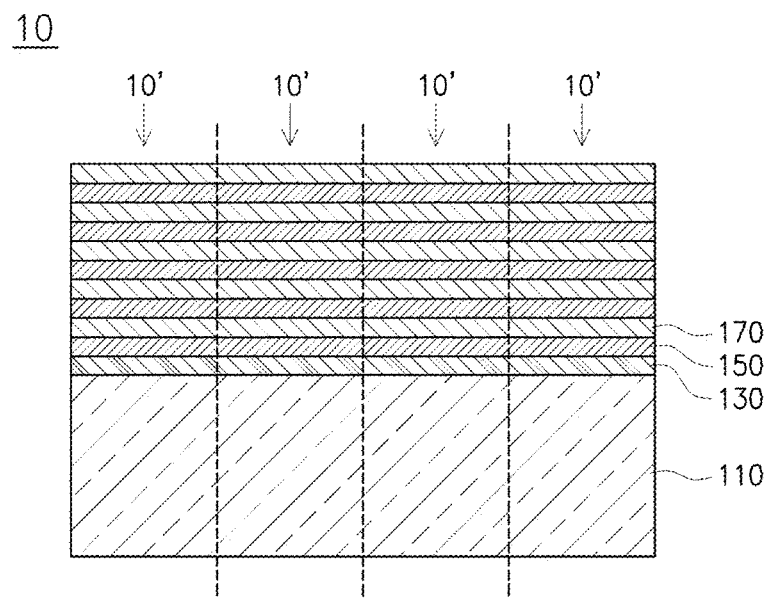
FIG. 5 is a sectional view illustrating a state in which the laminated high temperature-superconducting wire according to the embodiment of the present invention is cut to a plurality of pieces of wire.

Referring to FIG. 5, the laminated superconducting wire 10 may be cut along the laminating direction into at least one or more pieces of wires to form a plurality of cut superconducting wires 10' in which the superconducting layers having a reduced area are repeatedly laminated. In general, a loss of alternating current increases in proportion to the cross-sectional area of the superconducting layers. Accordingly, cutting of the laminated superconducting wire 10 along the laminating direction to reduce the cross-sectional area of the superconducting layers can reduce a loss of alternating current.

In a superconducting wire, the thicker the thickness of a superconducting layer, the more current can flow, and thus the larger the proportion of the superconducting layer in the total thickness of the superconducting wire, the higher the superconducting wire can be obtained. However, if the thickness of the superconducting layer is simply increased, biaxial texture of the superconducting layer may be deteriorated and thus high current cannot flow. Therefore, in the related art, a superconducting wire unit is manufactured by simply laminating superconducting wires and used. However, in the present invention, the superconducting wires are laminated, the buffer layer and the metal substrate except for the superconducting layer and the protective layer are removed, and the superconducting layer and the protective layer are repeatedly laminated to manufacture a superconducting wire capable of flowing a high current compared to the thickness.

Hereinafter, an embodiment of the present invention will be described in more detail.

A pair of 12 mmw. superconducting wires each of which includes a metal substrate, a buffer layer, a superconducting layer, and a protective layer, with the protective layer formed by coating of silver (Ag) is prepared. The prepared superconducting wires are wound on a circular Inconel bobbin, which is a winding bobbin, so that respective silver protective layers face each other. At this time, a dummy wire is co-wound, and the dummy wire is wound using a 0.05 t.×10 mmw. LMO-coated Hastelloy wire. As a winding method, the dummy wire is wound by about 10 turns at ~3 kgf, the pair of superconducting wires are laminated so that the protective layers face each other, and then the dummy wire is co-wound. At this time, the dummy wire is additionally wound by about 30 turns to prevent unwinding.

The wound superconducting wires are subjected to oxygen thermal treatment for 3 hours at 500° C. and taken out, whereby the laminated protective layers are joined together by diffusion into a single layer in which no interface exists. Thereafter, when the superconducting wires are separated from each other in response to the application of physical force, the superconducting layer and the buffer layer, which form a relatively weak bond therebetween, are separated because the protective layers are joined into a single layer, and thus a superconducting wire composed of the metal substrate, the buffer layer-the superconducting layer, the protective layer, and the superconducting layer and a wire composed of the metal substrate and the buffer layer are separated from each other.

Then, a silver protective layer is coated on an upper part of the superconducting wire having the superconducting layer exposed, the superconducting wire is then repeatedly subjected to winding on bobbins and thermal treatment together with another superconducting wire to join protective layers into a single layer, and a wire composed of a metal substrate and a buffer layer is separated from the superconducting wire. These processes are repeated to finally obtain a superconducting wire in which superconducting layers are repeatedly laminated.

Figure 6:
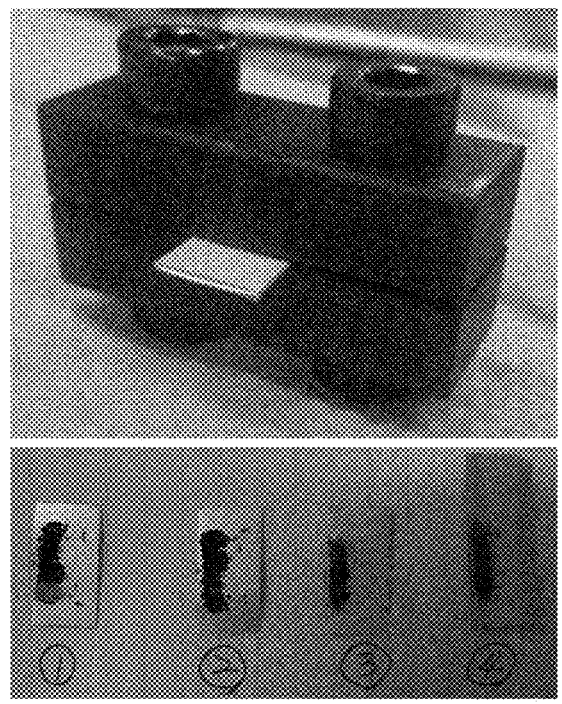
FIG. 6 is a photograph illustrating a state in which the superconducting wire is laminated using a planar pressure jig and a metal substrate is separate therefrom.
Figure 7:
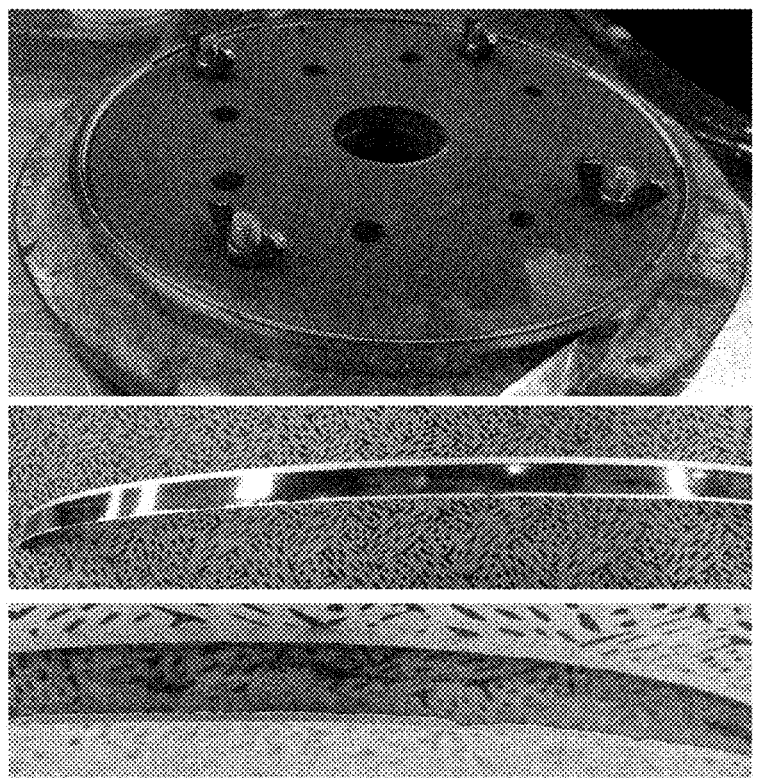
FIG. 7 is a photograph illustrating a state in which the superconducting wire is continuously pressurized using a winding bobbin and the metal substrate is separated therefrom.

FIG. 6 illustrates that superconducting wires are laminated using a planar pressure jig and then a metal substrate is separated therefrom. In this case, since the superconducting wires of long length cannot be continuously pressurized, and the metal substrate cannot be properly separated after pressurization, it is not easy to apply this to the present invention. On the other hand, as illustrated in FIG. 7, when superconducting wires are continuously pressurized using a winding bobbin and then a metal substrate is removed, it can be seen that the metal substrate is easily separated from a superconducting layer.

Figure 8:
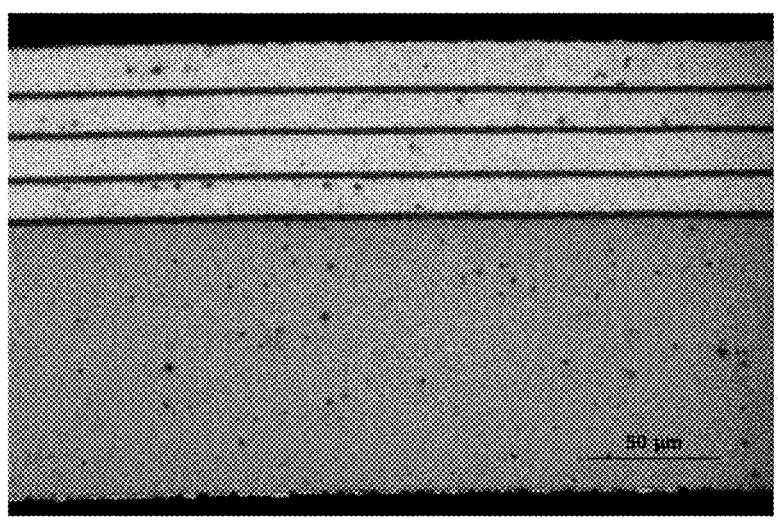
FIG. 8 is a sectional photograph illustrating the laminated high temperature-superconducting wire.

FIG. 8 illustrates a cross-sectional photograph illustrating a superconducting wire in which a plurality of superconducting layers and protective layers are laminated through the present invention, and it can be seen that superconducting layers and the protective layers of silver (Ag) are firmly laminated without being separated from each other.

Figure 9:
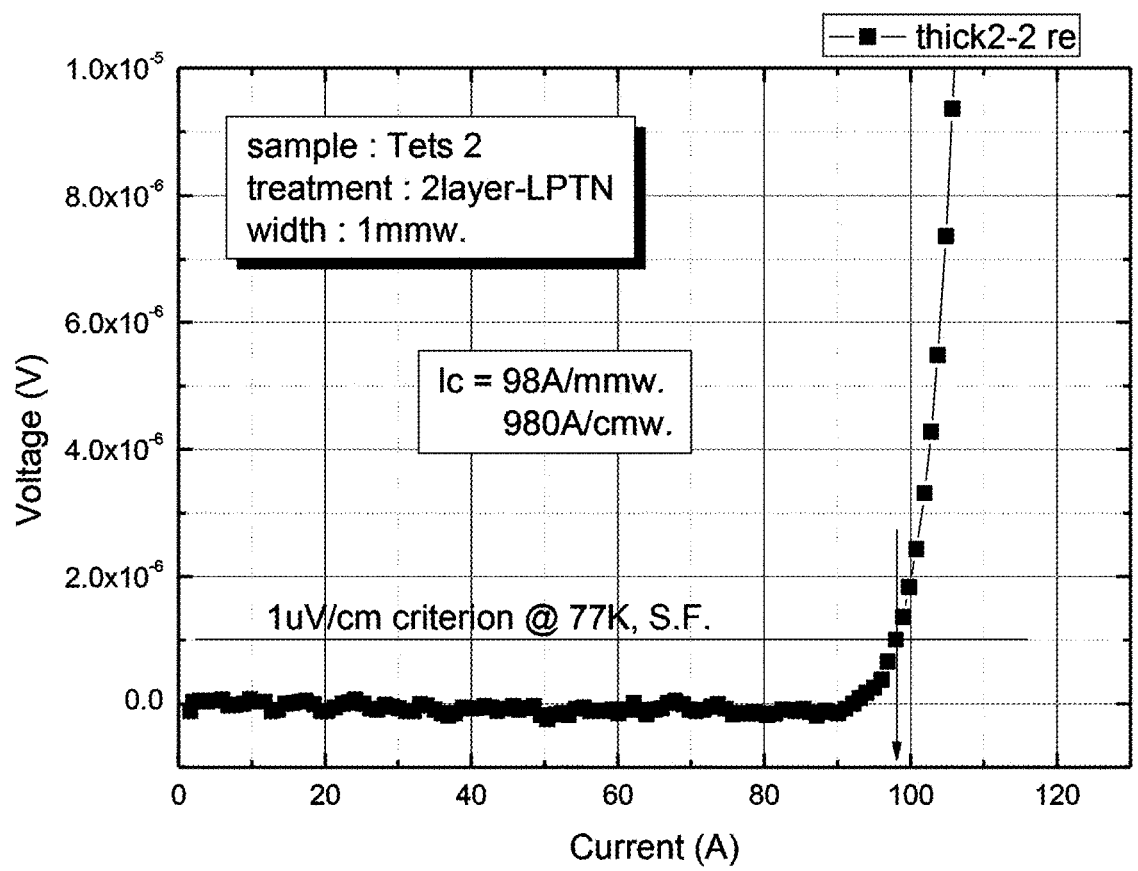
FIG. 9 is a graph illustrating critical current measurement results of the laminated high temperature-superconducting wire.

FIG. 9 illustrates a graph illustrating critical current measurement results using sample 1, and it can be seen that the measured width of a superconducting wire is 1 mm, but when the measured width is converted into a width of 10 mm, a critical current value of 980 A/cmw. is obtained.

What is claimed is:

1. A method of manufacturing a high temperature-superconducting wire having a superconducting layer laminated thereon, the method comprising;
   preparing a first superconducting wire which includes a first metal substrate, a first buffer layer, a first superconducting layer, and a first protective layer;
   preparing a second superconducting wire which includes a second metal substrate, a second buffer layer, a second superconducting layer, and a second protective layer;
   laminating the first and the second superconducting wires by arranging the first and the second superconducting wires so that the first and the second protective layers face each other and then winding the first and the second superconducting wires on a winding bobbin while applying tension thereto, wherein the first and the second superconducting wires are continuously pressurized by winding;
   performing thermal treatment to the first superconducting wire and the second superconducting wire at a temperature between 400 to 600° C. so that the first protective layer and the second protective layer are diffused and joined together to form a single protective layer in which no interface exists;
   exfoliating the second metal substrate and the second buffer layer from the second superconducting layer to expose the second superconducting layer;
   forming a third protective layer on an exposed surface of the second superconducting layer to form an intermediate superconducting wire;
   laminating a third superconducting wire that includes a third metal substrate, a third buffer layer, a third superconducting layer and a fourth protective layer such that the third and the fourth protective layers face each other and then winding the intermediate superconducting wire and the third superconducting wire on a winding bobbin while applying tension thereto, wherein the intermediate superconducting wire and the third superconducting wire are continuously pressurized by winding; and
   performing thermal treatment to the intermediate superconducting wire and the third superconducting wire at a temperature between 400 to 600° C. so that the third protective layer and the fourth protective layer are diffused and joined together to form a single protective layer in which no interface exists,
   wherein the buffer layers and the superconducting layers have a biaxially textured structure, in which the degree of in-plane orientation orientation ($\Delta\Phi$) is $2°<\Delta\Phi<10°$, and the degree of out-of-plane orientation ($\Delta\omega$) is $1°<\Delta\omega<7°$.

2. The method of claim 1, wherein the first and second superconducting layers have biaxially textured crystallites.

3. The method of claim 1, wherein the separating the second metal substrate is performed by exfoliating the second buffer layer and the second metal substrate, which form a relatively weaker bond than that of the second superconducting layer and the second protective layer, from the second superconducting layer by means of physical force.

4. The method of claim 1, wherein in the exfoliating the second metal substrate, the second metal substrate and the second buffer layer exfoliated from the second superconducting layer are reused.

5. The method of claim 1, wherein a material of the first superconducting layer is different from a material of the second and the third superconducting layers.

6. The method of claim 1, wherein at least one of the plurality of superconducting layers of the laminated superconducting wire has a different magnetic field property than other superconducting layers of the laminated superconducting wire.

7. The method of claim 1, wherein the laminated superconducting wire is cut along a laminating direction into at least one or more pieces of wires to form a plurality of cut superconducting wires.

8. The method of claim 1, wherein the first, second and third superconducting layers are made of a material including a flux pinning center, or a rare earth element-barium-copper-oxygen (RE-Ba—Cu—O) based material including rare earth.

9. The method of claim 1, wherein the first, second and third protective layers are made of a noble metal, and the noble metal is selected from the group consisting of silver (Ag), gold (Au), platinum (Pt), palladium (Pd), ruthenium (Ru), rhodium (Rh), iridium (Ir), osmium (Os), rhenium (Re), and a mixture thereof.

* * * * *